(12) United States Patent
Zhang et al.

(10) Patent No.: US 8,922,111 B2
(45) Date of Patent: Dec. 30, 2014

(54) CERAMIC BODY FOR LIGHT EMITTING DEVICES

(71) Applicant: Nitto Denko Corporation, Osaka (JP)

(72) Inventors: Bin Zhang, San Diego, CA (US); Hiroaki Miyagawa, Oceanside, CA (US); Toshitaka Nakamura, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/785,708

(22) Filed: Mar. 5, 2013

(65) Prior Publication Data

US 2013/0234587 A1    Sep. 12, 2013

Related U.S. Application Data

(60) Provisional application No. 61/607,361, filed on Mar. 6, 2012.

(51) Int. Cl.

| | | |
|---|---|---|
| *H01J 1/62* | (2006.01) | |
| *H01J 63/04* | (2006.01) | |
| *C09K 11/77* | (2006.01) | |
| *B32B 18/00* | (2006.01) | |
| *C04B 35/44* | (2006.01) | |
| *C04B 35/626* | (2006.01) | |
| *C04B 35/632* | (2006.01) | |
| *C04B 35/634* | (2006.01) | |
| *H01L 33/50* | (2010.01) | |

(52) U.S. Cl.
CPC ......... *C09K 11/7769* (2013.01); *C09K 11/7774* (2013.01); *B32B 18/00* (2013.01); *C04B 35/44* (2013.01); *C04B 35/6261* (2013.01); *C04B 35/632* (2013.01); *C04B 35/63488* (2013.01);

(Continued)

(58) Field of Classification Search
None
See application file for complete search history.

(56) References Cited

U.S. PATENT DOCUMENTS

| | | | |
|---|---|---|---|
| 6,069,440 | A | 5/2000 | Shimizu et al. |
| 7,015,640 | B2 | 3/2006 | Schaepkens et al. |

(Continued)

FOREIGN PATENT DOCUMENTS

| | | |
|---|---|---|
| CN | 101 181 798 | 5/2008 |
| WO | WO 2007/062136 | 5/2007 |

(Continued)

OTHER PUBLICATIONS

International Search Report and Written Opinion in PCT Application No. PCT/US2013/028943, dated Jun. 19, 2013.

(Continued)

*Primary Examiner* — Natalie Walford
(74) *Attorney, Agent, or Firm* — Knobbe, Martens, Olson & Bear, LLP

(57) ABSTRACT

Some embodiments disclosed herein include a ceramic body including a first region and a second region. The first region may include a host material and first concentration of a dopant that is effective to produce luminescence. The second region may include the host material and second concentration of the dopant. In some embodiments, the first region has an average grain size that is larger than an average grain of the second region. The ceramic body may, in some embodiments, exhibit superior internal quantum efficiency (IQE). Some embodiments disclosed herein include methods for the making and using the ceramic bodies disclosed herein. Also, some embodiments disclosed herein lighting apparatuses including the ceramic bodies disclosed herein.

22 Claims, 13 Drawing Sheets

(52) U.S. Cl.
CPC . *C04B 2235/3222* (2013.01); *C04B 2235/3224* (2013.01); *C04B 2235/3225* (2013.01); *C04B 2235/3229* (2013.01); *C04B 2235/3418* (2013.01); *C04B 2235/5409* (2013.01); *C04B 2235/6025* (2013.01); *C04B 2235/6562* (2013.01); *C04B 2235/6565* (2013.01); *C04B 2235/6567* (2013.01); *C04B 2235/658* (2013.01); *C04B 2235/6581* (2013.01); *C04B 2235/6585* (2013.01); *C04B 2235/6587* (2013.01); *C04B 2235/663* (2013.01); *C04B 2235/763* (2013.01); *C04B 2235/786* (2013.01); *C04B 2235/9653* (2013.01); *C04B 2237/34* (2013.01); *C04B 2237/341* (2013.01); *C04B 2237/343* (2013.01); *C04B 2237/36* (2013.01); *C04B 2237/368* (2013.01); *C04B 2237/565* (2013.01); *C04B 2237/582* (2013.01); *C04B 2237/588* (2013.01); *C04B 2237/702* (2013.01); *C04B 2237/704* (2013.01); *H01L 33/50* (2013.01)
USPC ........... 313/503; 313/483; 313/500; 313/501; 313/502; 313/504; 313/505; 313/506

(56) References Cited

U.S. PATENT DOCUMENTS

| | | |
|---|---|---|
| 7,259,396 B2 | 8/2007 | Tasch et al. |
| 7,381,362 B2 | 6/2008 | Uemoto et al. |
| 7,514,721 B2 | 4/2009 | Krames et al. |
| 7,554,258 B2 | 6/2009 | Rossner et al. |
| 7,799,267 B2 | 9/2010 | Messing et al. |
| 8,828,531 B2 | 9/2014 | Pan et al. |
| 2004/0145308 A1 | 7/2004 | Rossner et al. |
| 2005/0269582 A1 | 12/2005 | Mueller et al. |
| 2006/0284196 A1 | 12/2006 | Setlur et al. |
| 2007/0215890 A1 | 9/2007 | Harbers et al. |
| 2007/0263969 A1 | 11/2007 | Huang et al. |
| 2008/0149956 A1 | 6/2008 | Mueller-Mach et al. |
| 2008/0187746 A1 | 8/2008 | De Graaf et al. |
| 2008/0211389 A1 | 9/2008 | Oshio |
| 2009/0108507 A1 | 4/2009 | Messing et al. |
| 2009/0212697 A1 | 8/2009 | Nakamura et al. |
| 2010/0012964 A1 | 1/2010 | Copic et al. |
| 2010/0067214 A1 | 3/2010 | Hoelen et al. |
| 2010/0276717 A1 | 11/2010 | Boerkekamp et al. |
| 2011/0116263 A1 | 5/2011 | Cillessen et al. |
| 2011/0227477 A1 | 9/2011 | Zhang et al. |
| 2012/0001214 A1 | 1/2012 | Ooyabu et al. |
| 2012/0141771 A1 | 6/2012 | Pan et al. |
| 2013/0313967 A1 | 11/2013 | Zhang et al. |

FOREIGN PATENT DOCUMENTS

| | | |
|---|---|---|
| WO | WO 2008/149256 | 12/2008 |
| WO | WO 2009/038674 | 3/2009 |
| WO | WO 2010/010484 | 1/2010 |
| WO | WO 2011/115820 | 9/2011 |
| WO | WO 2012/075018 | 6/2012 |
| WO | WO 2013/134163 | 8/2013 |

OTHER PUBLICATIONS

U.S. Appl. No. 61/446,346, filed Feb. 24, 2011.
International Preliminary Report on Patentability in PCT Application No. PCT/US2013/028943, dated Sep. 18, 2014.

CERAMIC BODY FOR LIGHT EMITTING DEVICES

CROSS-REFERENCE TO RELATED APPLICATIONS

This application claims the benefit of U.S. Provisional Patent Application No. 61/607,361, filed Mar. 6, 2012, which is incorporated by reference herein in its entirety.

BACKGROUND

1. Field

The present application relates to emissive ceramic materials having phosphor components.

2. Description

Solid state light emitting devices such as light emitting diode (LED), organic light emitting diode (OLED) or sometimes called organic electroluminescent device (OEL), and inorganic electroluminescent device (IEL) have been widely utilized for various applications such as flat panel display, indicator for various instrument, signboard, and ornamental illumination, etc. As the emission efficiency of these light emitting devices continues to improve, applications that require much higher luminance intensity, such as automobile headlights and general lighting, may soon become feasible. For these applications, white-LED is one of the promising candidates and have attracted much attention.

Internal quantum efficiency (IQE) is the ratio of photons created by an emissive material to the photons absorbed by the same material. An increased IQE value can improve a lighting apparatus's energy efficiency; however, there is still no reliable method for increasing IQE without also diminishing the luminance efficiency. Thus, there is a need for new emissive materials that can overcome these limitations regarding IQE.

SUMMARY

Some embodiments disclosed herein include a ceramic body including: a first region comprising a host material and a first concentration of a dopant, wherein the first concentration is effective to produce luminescence; and a second region comprising the host material and a second concentration of the dopant, wherein the second concentration is less than the first concentration, wherein the first region has an average grain size larger than an average grain size of the second region.

Some embodiments disclosed herein include a method of forming a ceramic body including: forming an assembly, wherein forming the assembly including: providing a first non-doped layer comprising a host material, a host material precursor, or combination thereof, wherein the first non-doped layer has a thickness in the range of about 40 μm to about 800 μm; and disposing a doped layer on the first non-doped layer, wherein the doped layer has a thickness in the range of about 10 μm to about 400 μm, and comprises the host material, the host material precursor, or combination thereof, and a dopant; and sintering an assembly to form a first region of the ceramic body having an average grain size larger than an average grain size of a second region of the ceramic body; wherein the first region comprises a first concentration of the dopant that is effective to produce luminescence, and the second region comprises a second concentration of the dopant that is less than the first concentration of the dopant.

Some embodiments disclosed herein include a ceramic body prepared by any of the methods disclosed herein.

Some embodiments disclosed herein include a lighting apparatus including: a light source configured to emit blue radiation; and any of the ceramic bodies disclosed herein, wherein the ceramic body is configured to receive at least a portion of the blue radiation.

Some embodiments disclosed herein include a method of producing light including exposing any of the ceramic bodies disclosed herein to a blue radiation.

DETAILED DESCRIPTION

Some embodiments disclosed herein include a ceramic body including a first region and a second region. The first region may include a host material and a first concentration of a dopant that is effective to produce luminescence. The second region may include the host material and a second concentration of the dopant. In some embodiments, the first region has an average grain size that is larger than an average grain of the second region. The ceramic body may, in some embodiments, exhibit superior internal quantum efficiency (IQE). Some embodiments disclosed herein include methods for the making and using the ceramic bodies disclosed herein. Also, some embodiments disclosed herein include lighting apparatuses comprising the ceramic bodies disclosed herein.

The ceramic body may, for example, be prepared by sintering an assembly. Therefore, a "ceramic body" generally describes the final emissive material that can be used for lighting purposes, while an "assembly" is a composite that may be sintered to form the emissive ceramic. As will be discussed further below, sintering an assembly is one method for obtaining a ceramic body having the first region and the second region.

Figure 1A:
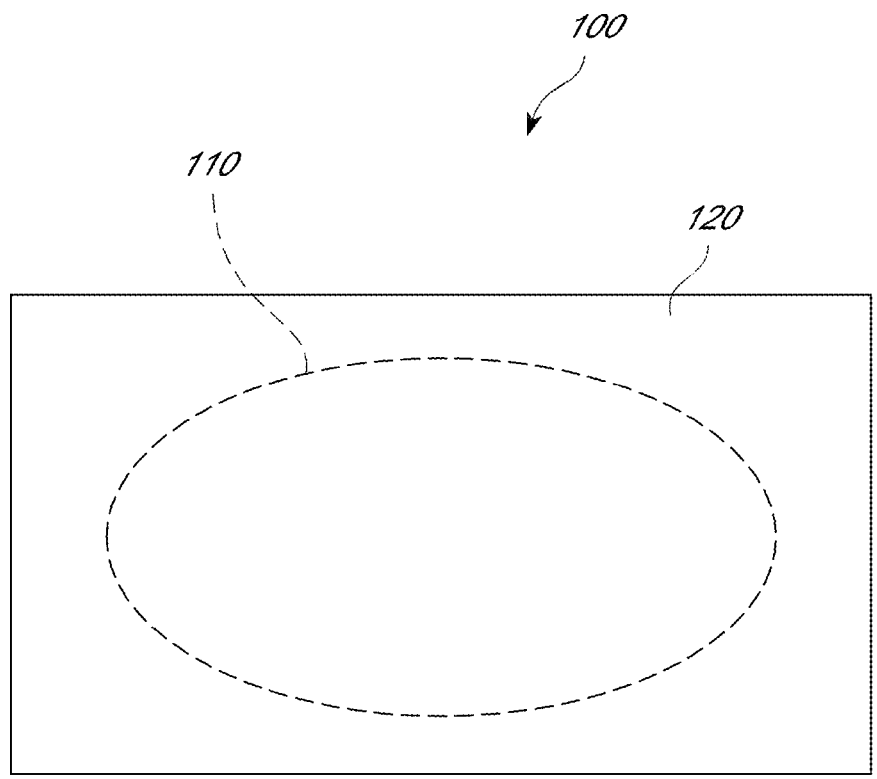
FIGS. 1A-B show top and side views, respectively, of one example of a ceramic body within the scope of the present application.
Figure 1B:
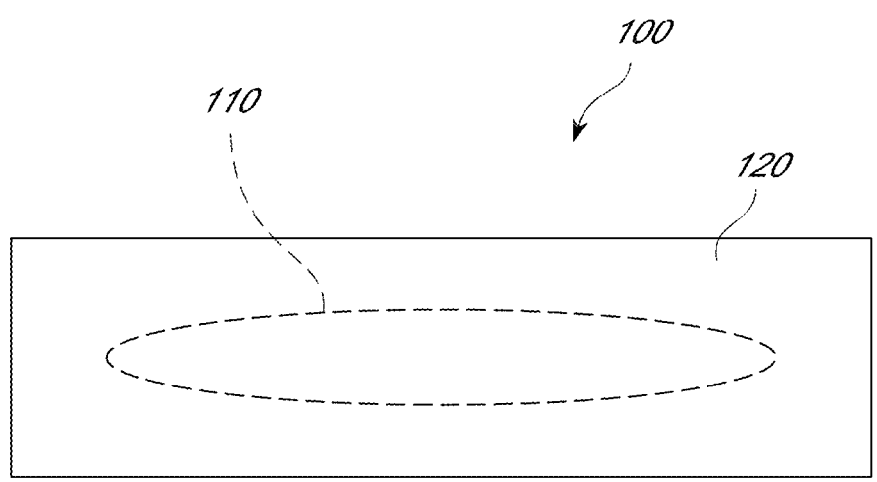

FIGS. 1A and 1B show top and side views, respectively, of one example of a ceramic body within the scope of the present application. Ceramic body 100 includes first region 110 and second region 120. First region 110 can include a host material and a first concentration of a dopant that is effective to produce luminescence. Second region 120 can include the host material and a second concentration of the dopant. The second concentration of the dopant in second region 120 may be less than the first concentration of the dopant in first region 110. An average grain size of first region 110 can be greater than an average grain size of second region 120.

As depicted, first region 110 may be generally located near the center of ceramic body 100. Thus, in some embodiments, the first region may include a central core of the ceramic body. As depicted, second region 120 may be generally located at or near the outer surface of ceramic body 100. In some embodiments, the second region may include at least a portion of the outer surface of the ceramic body. In some embodiments, the second region may include substantially all of the outer surface of the ceramic body.

The first region and second region may, in some embodiments, together include an entire volume of the ceramic body. That is, a sum of a volume of the first region and a volume of the second range may be about the same as a volume of the ceramic body. For example, as depicted in FIGS. 1A and 1B, first region 110 and second region 120 together form all of the ceramic body 100. In some embodiments, the ceramic body consists of the first region and the second region. In some embodiments, the ceramic body consists essentially of the first region and the second region. In some embodiments, the first region 110 is substantially surrounded by the second region 120 in a ceramic body 100.

Figure 2A:
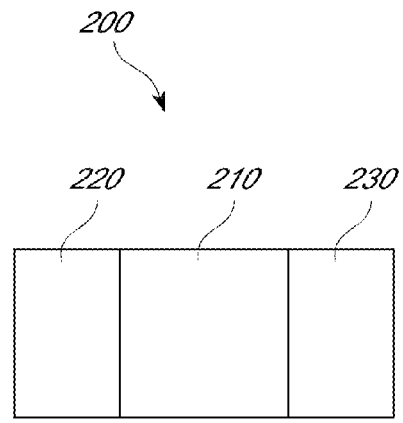
FIGS. 2A-B show top and side views, respectively, of one example of a ceramic body within the scope of the present application.
Figure 2B:
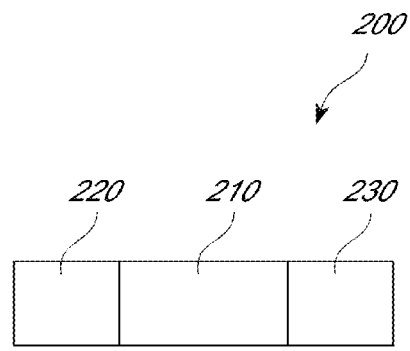

FIGS. 2A and 2B show top and side views, respectively, of another example of a ceramic body within the scope of the present application. Ceramic body 200 includes first region 210, second region 220, and third region 230. First region 210 can include a host material and a first concentration of a dopant that is effective to produce luminescence. Second region 220 can include the host material and a second concentration of the dopant. Third region 230 can include the host material and a third concentration of the dopant. The second concentration of the dopant in second region 220 and the third concentration of the dopant in third region 230 may each be less than the first concentration of the dopant in the first region. An average grain size of first region 210 can be greater than each of an average grain size of second region 220 and an average grain size of third region 230.

The relative concentration of the dopant for the second region and the third region (e.g., second region 220 and third region 230 depicted in FIGS. 2A and 2B) is not particularly limited. In some embodiments, the second concentration of the dopant in the second region is about the same as the third concentration in the third region. In some embodiments, the second concentration of the dopant in the second region is greater than the third concentration in the third region. In some embodiments, the second concentration of the dopant in the second region is less than the third concentration in the third region.

The relative average grain size for the second region and third region (e.g., second region 220 and third region 230 depicted in FIGS. 2A and 2B) is also not particularly limited. In some embodiments, the average grain size in the second region is about the same as the average grain size in the third region. In some embodiments, the average grain size in the second region is less than the average grain size in the third region. In some embodiments, the average grain size in the second region is greater than the average grain size in the third region.

The first region, the second region, and the third region may, in some embodiments, together include an entire volume of the ceramic body. That is, a sum of a volume of the first region, a volume of the second region, a volume of the third range may be about the same as a volume of the ceramic body. For example, as depicted in FIGS. 2A and 2B, first region 210, second region 220, and third region 230 together form all of ceramic body 200. In some embodiments, the first region, the second region, and the third region may together include a substantial volume of the ceramic body. In some embodiments, the ceramic body consists of the first region, the second region, and the third region. In some embodiments, the ceramic body consists essentially of the first region, the second region, and the third region.

As will be appreciated by the skilled artisan, guided by the teachings of the present application, the geometry of the ceramic body is not particularly limited and can be readily varied. Thus, numerous other geometries are within the scope of the present application, which is not limited to the generally cuboid geometries portrayed in FIGS. 1 and 2. Similarly, the geometry of the regions in the ceramic body are not particularly limited. For example, the regions may have curved contours (e.g., as depicted in FIG. 1) or form layers (e.g., as depicted in FIG. 2). Other geometries for the regions in the ceramic body are also within the scope of the present application.

The volume of the first region is not particularly limited. The volume of the first region relative to the total volume of the ceramic body may, for example, be at least about 10%; at least about 25%; at least about 40%; at least about 50%; at least about 60%; at least about 75%; at least about 90%; or at least about 95%. The volume of the first region relative to the total volume of the ceramic body may, for example, be no more than about 98%; no more than about 95%; no more than about 90%; no more than about 80%; no more than about 70%; no more than about 50%; or no more than about 40%. In some embodiments, the volume of the first region relative to the total volume of the ceramic body is in the range of about 10% to about 98%. In some embodiments, the volume of the first region relative to the total volume of the ceramic body is in the range of about 25% to about 90%.

The volume of the second region is also not particularly limited. The volume of the second region relative to the total volume of the ceramic body may, for example, be at least about 1%; at least about 5%; at least about 10%; at least about 20%; at least about 25%; or at least about 40%. The volume of the second region relative to the total volume of the ceramic body may, for example, be no more than about 90%; no more than about 75%; no more than about 50%; no more than about 40%; no more than about 30%; no more than about 20%; or no more than about 10%. In some embodiments, the volume of the second region relative to the total volume of the ceramic body is in the range of about 10% to about 98%. In some embodiments, the volume of the second region relative to the total volume of the ceramic body is in the range of about 25% to about 90%. In some embodiments, the volume of the second region is less than the volume of the first region.

The volume of the optional third region is also not particularly limited. The third region may, for example, have any of the volume percentages described above with respect to the second region. In some embodiments, the volume of the third region is about the same as the volume of the second region. In some embodiments, the volume of the third region is greater than the volume of the second region. In some embodiments, the volume of the third region is less than the volume of the second region. In some embodiments, the volume of the first region is greater than the volume of the first region.

The host material in the regions of the ceramic body (e.g., the first region, the second region, and optionally the third region in the ceramic body) can include various known host materials. In some embodiments, the host material is represented by the formula $A_3B_5O_{12}$, where A is selected from the group consisting of Y, Lu, Ca, La, Tb, Gd and combinations thereof; and B is selected from the group consisting of Al, Mg, Si, Ga, In, and combinations thereof. In some embodiments, A includes Y. In some embodiments, A includes Gd. In some embodiments, A includes Y and Gd. In some embodiments, A includes Lu. In some embodiments, B includes Al. Non-limiting examples of host materials that may be included in the region of the ceramic body include $Y_3Al_5O_{12}$, $(Y, Tb)_3Al_5O_{12}$, $(Y, Gd)_3Al_5O_{12}$, $(Y, Gd)_3(Al, Ga)_5O_{12}$, $(Sr, Ca, Ba)_2SiO_4$, $Lu_3Al_5O_{12}$, $Lu_2CaMg_2Si_3O_{12}$, $Lu_2CaAl_4SiO_{12}$, $Ca_3Sc_2Si_3O_{12}$, $Ba_3MgSi_2O_8$, $BaMgAl_{10}O_{17}$, $La_2O_2S$, $SrGa_2S_4$, $CaAlSiN_3$, $Ca_2Si_5N_8$, and CaSiAlON. In some embodiments, the host material is a garnet. In some embodiments, the host material is $(Y_{1-y}Gd_y)_3Al_5O_{12}$, where $0.05 < y < 0.40$. In some embodiments, the host material is $(Y_{1-y}Gd_y)_3Al_5O_{12}$, where $0.05 < y < 0.15$. In some embodiments, the host material is $(Y_{0.90}Gd_{0.10})_3Al_5O_{12}$. In some embodiments, the host material is $Y_3Al_5O_{12}$.

In some embodiments, the dopant in the ceramic body can be a rare earth metal. Non-limiting examples of dopants include Nd, Er, Eu, Cr, Yb, Sm, Tb, Ce, Pr, By, Ho, Lu, and combinations thereof. In some embodiments, the dopant is Ce. As an example, a doped yttrium aluminum garnet region in the ceramic body may be represented by the formula $(Y_{1-x}Ce_x)_3Al_5O_{12}$, where $0 < x \leq 1$. As another example, a doped yttrium aluminum garnet region in the ceramic body may be represented by the formula $(Y_{1-y-x}Gd_yCe_x)_3Al_5O_{12}$, where $0 < y+x \leq 1$. In some embodiments, $0.05 < y < 0.40$ and/or $0.0001 < x < 0.02$. In some embodiments, $0.5 < y < 0.15$ and/or $0.002 < x < 0.005$.

The first concentration dopant in the first region can vary. The first concentration of dopant in the first region can be, for example, at least about 0.01 atomic % (at %); at least about 0.05 at %; at least about 0.1 at %; at least about 0.2 at %; at least about 0.3 at %; at least about 0.5 at %; at least about 0.8 at %; at least about 1 at %; at least about 1.5 at %; or at least about 2 at %. The first concentration of dopant in the first region can be, for example, no more than about 10 at %; no more than about 5 at %; no more than about 4 at %; no more than about 2 at %; no more than about 1.5 at %; no more than about 1 at %; no more than about 0.8 at %; or no more than about 0.5 at %. In some embodiments, the first concentration of dopant in the first region can be in the range of about 0.01 at % to about 10 at %. In some embodiments, the first concentration of dopant in the first region can be in the range of about 0.2 at % to about 1 at %.

The second concentration of dopant in the second region can be less than the first concentration of dopant in the first region. In some embodiments, the second concentration of dopant in the second region is no more than about 0.2 at %. In some embodiments, the second concentration of dopant in the second region is no more than about 0.1 at %. In some embodiments, the second concentration of dopant in the second region is no more than about 0.05 at %. In some embodiments, the second concentration of dopant in the second region is at least about 0.001 at %. In some embodiments, the second concentration of dopant in the second region is at least about 0.005 at % In some embodiments, the second concentration of dopant in the second region is at least about 0.01 at %. In some embodiments, the second concentration of dopant in the second region is at least about 0.05 at %. In some embodiments, the second concentration of dopant in the second region is the range of about 0.001 at % to about 0.2 at %.

A ratio of the first concentration of dopant in the first region to the second concentration of dopant in the second region may be varied. The ratio of the first concentration of dopant in the first region to the second concentration of dopant in the second region may, for example, be greater than 1:1; at least about 1.2:1; at least about 1.5:1; at least about 1.7:1; at least about 2:1; or at least about 3:1. The ratio of the first concentration of dopant in the first region to the second concentration of dopant in the second region may, for example, be no more than about 4:1; no more than about 3.5:1; no more than about 3:1; no more than about 2:1; or no more than about 1.5:1. In some embodiments, the ratio of the first concentration of dopant in the first region to the second concentration of dopant in the second region can be in the range of about 4:1 to 1:1.

The third concentration of dopant in the third region can be less than the first concentration of dopant in the first region. In some embodiments, the third concentration of dopant in the third region is about the same as the second concentration of dopant in the second region. In some embodiments, the third concentration of dopant in the third region is less than the second concentration of dopant in the second region. In some embodiments, the third concentration of dopant in the third region can is greater than the second concentration of dopant in the second region. In some embodiments, the third region has an average grain size less than an average grain size of the second region, and the third concentration of dopant in the third region is less than the second concentration of dopant in the second region. In some embodiments, the third region has an average grain size greater than an average grain size of the second region, and the third concentration of dopant in the third region is greater than the second concentration of dopant in the second region.

In some embodiments, the third concentration of dopant in the third region is no more than about 0.2 at %. In some embodiments, the third concentration of dopant in the third region is no more than about 0.1 at %. In some embodiments, the third concentration of dopant in the third region is no more than about 0.05 at %. In some embodiments, the third concentration of dopant in the third region is at least about 0.001 at %. In some embodiments, the third concentration of dopant in the third region is at least about 0.005 at % In some embodiments, the third concentration of dopant in the third region is at least about 0.01 at %. In some embodiments, the third concentration of dopant in the third region is at least about 0.005 at %. In some embodiments, the third concentration of dopant in the third region is the range of about 0.001 at % to about 0.2 at %.

A ratio of the first concentration of dopant in the first region to the optional third concentration of dopant in the third region may be varied. The ratio of the first concentration of dopant in the first region to the third concentration of dopant in the third region may, for example, be more than 1:1; at least about 1.2:1; at least about 1.5:1; at least about 1.7:1; at least about 2:1; or at least about 3:1. The ratio of the first concentration of dopant in the first region to the third concentration of dopant in the third region may, for example, be no more than about 4:1; no more than about 3.5:1; no more than about 3:1; no more than about 2:1; or no more than about 1.5:1. In some embodiments, the ratio of the first concentration of dopant in the first region to the third concentration of dopant in the third region can be about 4:1 to 1:1.

The average grain size for the first region is not particularly limited so long as it is greater than the average grain size for the second region. The average grain size for the first region may, for example, be at least about 5 µm; at least about 10 µm; at least about 20 µm; at least about 30 µm; at least about 40 µm; at least about 50 µm; or at least about 75 µm. In some embodiments, the average grain size for the first region may, for example, be no more than about 100 µm; no more than about 75 µm; no more than about 50 µm; no more than about 40 µm; or no more than about 30 µm. In some embodiments, the average grain size for the first region can be in the range of about 5 µm to about 100 µm. In some embodiments, the average grain size for the first region can be in the range of about 10 µm to about 80 µm.

The average grain size for the second region is not particularly limited so long as it is less than the average grain size for the first region. The average grain size for the second region may, for example, be no more than about 30 µm; no more than about 20 µm; no more than about 10 µm; or no more than about 5 µm. The average grain size for the second region may, for example, be at least about 1 µm; at least about 5 µm; at least about 10 µm; or at least about 20 µm. In some embodiments, the average grain size for the second region can be no more than about 30 µm. In some embodiments, the average grain size for the second region can be in the range of about 1 µm to about 30 µm. In some embodiments, the average grain size for the second region can be in the range of about 5 µm to about 30 µm.

The average grain size for the optional third region is not particularly limited so long as it is less than the average grain size for the first region. The average grain size for the third region may, for example, be no more than about 30 µm; no more than about 20 µm; no more than about 10 µm; or no more than about 5 µm. The average grain size for the third region may, for example, be at least about 1 µm; at least about 5 µm; at least about 10 µm; or at least about 20 µm. In some embodiments, the average grain size for the third region can be no more than about 30 µm. In some embodiments, the average grain size for the third region can be in the range of about 1 µm to about 30 µm. In some embodiments, the average grain size for the third region can be in the range of about 5 µm to about 30 µm. In some embodiments, the average grain size of the optional third region is about the same as the average grain size of the second region. In some embodiments, the average grain size of the optional third region is about the greater than the average grain size of the second region. In some embodiments, the average grain size of the optional third region is less than the average grain size of the second region.

As disclosed above, one advantage of the ceramic bodies disclosed herein is that they can exhibit superior internal quantum efficiencies. In some embodiments, the ceramic body can exhibit an internal quantum efficiency (IQE) of at least about 0.80 when exposed to radiation having a wavelength of about 455 nm. In some embodiments, the ceramic body can exhibit an internal quantum efficiency (IQE) of at least about 0.85 when exposed to radiation having a wavelength of about 455 nm. In some embodiments, the ceramic body can exhibit an internal quantum efficiency (IQE) of at least about 0.90 when exposed to radiation having a wavelength of about 455 nm.

Methods of Making Emissive Ceramics

Some embodiments disclosed herein include methods of forming a ceramic body, such as any of the ceramic bodies disclosed above. The method may include, in some embodiments, sintering an assembly, where the assembly includes a doped layer interposed between two non-doped layers.

Various methods are known in the art for sintering an assembly to form the ceramic body. For example, two or more cast tapes may be laminated and sintered according to the disclosure in U.S. Pat. No. 7,514,721, U.S. Publication No. 2009/0108507, U.S. Application No. 61/446,346, and U.S. application Ser. No. 13/306,797. As another example, the ceramic body may be prepared by molding and sintering phosphor mixtures, as disclosed in U.S. Publication No. 2009/0212697 and U.S. Application No. 61/315,763.

Figures 3A, 3B:
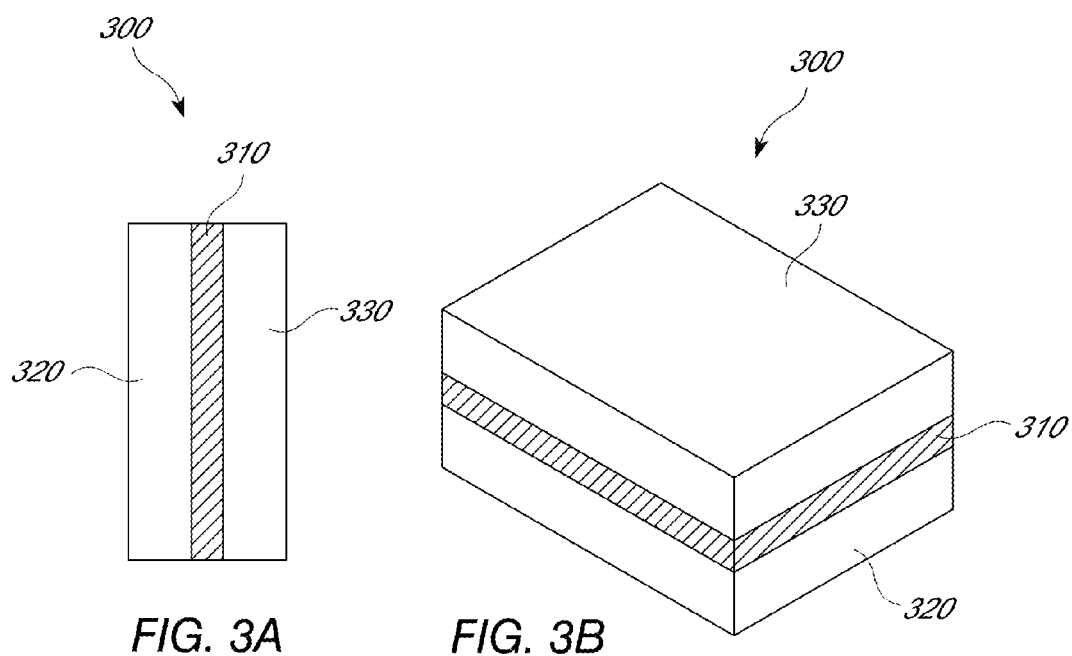
FIGS. 3A-B illustrate one example of an assembly that may be sintered according to the methods disclosed herein.

FIGS. 3A and 3B illustrate an embodiment of an assembly that may be sintered according to the methods disclosed herein. FIG. 3A is a side view of assembly 300 having a doped layer 310 interposed between first non-doped layer 320 and second non-doped layer 330. FIG. 3B shows a perspective view of assembly 300. Assembly 300 may, for example, be configured and sintered under appropriate conditions to obtain a ceramic body having the first region, the second region, and the third region (e.g., as depicted in FIGS. 2A and 2B).

The doped layer of the assembly can include a host material, host material precursor, or a combination thereof. The host material can be any of those materials described above with respect to the ceramic body. For example, the host material can be yttrium aluminum garnet. A host material precursor can be any components that will form the host material during the process (e.g., during sintering). As an example, a yttrium aluminum garnet precursor may be a mixture of $Y_2O_3$ and $Al_2O_3$ at the stoichiometric ratio of 3:5 that forms yttrium aluminum garnet during sintering. In some embodiments, the doped layer includes at least about 50% host material and/or its equivalent amount of precursor. In some embodiments, the doped layer includes at least about 80% host material and/or its equivalent amount of precursor. In some embodiments, the doped layer includes at least about 90% host material and/or its equivalent amount of precursor. In some embodiments, the doped layer consists essentially of host material and the desired dopant.

The doped layer also includes a dopant, such as Nd, Er, Eu, Cr, Yb, Sm, Tb, Ce, Pr, Dy, Ho, Lu and combinations thereof. In some embodiments, the dopant is Ce. The amount of dopant in the doped layer can be an amount effective to impart luminescence upon the emissive ceramic after sintering is complete. In some embodiments, the doped layer includes about 0.1 at % to about 10 at % dopant. The doped layer may, for example, include at least about 0.5 at %; at least about 1 at %; at least about 1.5 at %; or at least about 2 at % of the dopant. The doped layer may, for example, include no more than about 5 at %; no more than about 4 at %; no more than about 3.5 at %; no more than about 3 at % of the dopant; no more than about 2 at % of the dopant; no more than about 1.5 at % of the dopant; or no more than about 1 at % of the dopant. The doped layer may, for example, include at least about 0.01 at %; at least about 0.05 at %; at least about 0.1 at %; at least about 0.5 at %; or at least about 1 at %. In some embodiments, the doped layer contains a generally uniform distribution of dopant.

The non-doped layers in the assembly can also include a host material, a host material precursor, or a combination thereof. The host material in the non-doped layers may be the same or different than the host material in the doped layer. In some embodiments, the host material is yttrium aluminum garnet. In some embodiments, the non-doped layer includes at least about 50% host material and/or its equivalent amount of precursor. In some embodiments, the non-doped layer includes at least about 80% host material and/or its equivalent amount of precursor. In some embodiments, the non-doped layer includes at least about 90% host material and/or its equivalent amount of precursor. In some embodiments, the non-doped layer consists essentially of host material and/or its equivalent amount of precursor. However, the non-doped layers can be substantially free of dopant. In some embodiments, the non-doped layers can include an amount of dopant that is ineffective for imparting luminescence upon the emissive ceramic. In some embodiments, the non-doped layers can include less than about 0.05 at % dopant. In some embodiments, the non-doped layers can include less than about 0.01 at % dopant. In some embodiments, the non-doped layers can include less than about 0.001 at % dopant.

In some embodiments, the relative thickness of the doped layer and non-doped layers may affect the distribution of dopants in the different regions of the ceramic body. For example, in the case of a thinner doped layer, dopant within the doped layer can diffuse into the neighboring non-doped layers, which reduces the maximum dopant concentration.

In some embodiments, the doped layer has a thickness configured to enable a reduction of the initial dopant concentration within the doped layer. In some embodiments, the doped layer has a thickness configured to enable diffusion from the doped layer and into the non-emissive layer(s) or non-doped layer(s) during sintering. In some embodiments, the doped layer has a thickness in the range of about 10 µm to about 400 µm. In some embodiments, the doped layer has a thickness in the range of about 40 µm to about 200 µm. The doped layer may, for example, have a thickness that is at least about 20 µm; at least about 30 µm; at least about 40 µm; at least about 50 µm; at least about 100 µm; at least about 150 µm; or at least about 200 µm. The doped layer may also, for example, have a thickness that is no more than about 400 µm; no more than about 300 µm; no more than about 250 µm; no more than about 200 µm; no more than about 150 µm; no more than about 120 µm; no more than about 100 µm; no more than about 80 µm; or no more than about 70 µm.

The non-doped layers may each independently have a thickness in the range of about 40 µm to about 800 µm. In some embodiments, the non-doped layers may each independently have a thickness in the range of about 40 µm to about 400 µm. The non-doped layers may, for example, each independently have a thickness that is at least about 40 µm; at least about 80 µm; at least about 100 µm; or at least about 200 µm. The non-doped layers may, for example, each independently have a thickness that is no more than about 400 µm; no more than about 300 µm; no more than about 250 µm; no more than about 200 µm; no more than about 150 µm. In some embodiments, at least one non-doped layer (e.g., one or two non-doped layers) may be less than or equal to the thickness of the doped layer. In some embodiments, at least one non-doped layer (e.g., one or two non-doped layers) is greater than or equal to the thickness of the doped layer.

The assembly may consist essentially of a doped layer and two non-doped layers (e.g., assembly 300 in FIGS. 3A and 3B). In other words, the assembly includes a doped layer and two non-doped layers, but excludes any other layers that form an emissive region. The first and second non-doped layers can each independently have any thickness, such as those disclosed above. For example, the first non-doped layer may have a thickness in the range of about 40 µm to about 400 µm, and the second non-doped layer may have a thickness in the range of about 40 µm to about 400 µm. In some embodiments, the first non-doped layer is thicker than the doped layer. In some embodiments, the second non-doped layer is thicker than the doped layer. In some embodiments, both the first and second non-doped layers are thicker than the doped layer. In some embodiments, the first and second non-doped layers have different thicknesses. In some embodiments, the first and second non-doped layers have thicknesses that are about the same.

The total thickness of the assembly is not particularly limited. In some embodiments, the assembly can have a thickness in the range of about 10 µm and 1 mm. The assembly may have a thickness, for example, of at least about 10 µm; at least about 50 µm; at least about 100 µm; at least about 200 µm; or at least about 250 µm. The assembly may have a thickness, for example, of no more than about 1 mm; no more than about 800 µm; no more than about 600 µm; no more than about 400 µm; or no more than about 300 µm.

Figure 4:
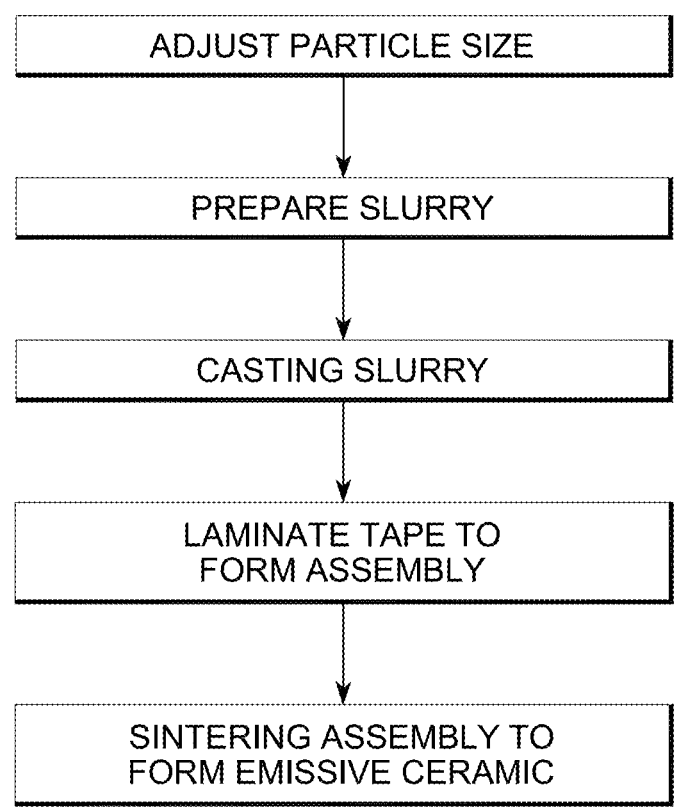
FIG. 4 shows a preparation flow diagram for one embodiment of forming the ceramic body that includes lamination.

FIG. 4 shows a preparation flow diagram for one embodiment of forming the emissive ceramic that includes lamination. First, the particle size of the raw materials (e.g., nitrate or oxide based raw materials, such as $Y_2O_3$ and $Al_2O_3$ for forming YAG) may optionally be adjusted to reduce cracking in the cast tapes from capillary forces during evaporation of solvents. For example, the particle size can be adjusted by pre-annealing raw material particles to obtain the desired particle size. Raw material particles can be pre-annealed in the temperature range of about 800° C. to about 1800° C. (or more preferably 1000° C. to about 1500° C.) to obtain the desired particle size. The pre-annealing may occur in a vacuum, air, $O_2$, $H_2$, $H_2/N_2$, or a noble gas (e.g., He, Ar, Kr, Xe, Rn, or combinations thereof). In an embodiment, each of the raw materials (e.g., $Y_2O_3$ and $Al_2O_3$ for forming YAG) is adjusted to be about the same particle size. In another embodiment, the particles have a BET surface area in the range of about 0.5 $m^2/g$ to about 20 $m^2/g$, about 1.0 $m^2/g$ to about 10 $m^2/g$, or about 3.0 $m^2/g$ to about 6.0 $m^2/g$.

A slurry may then be prepared for subsequently casting into a tape. Pre-made phosphors (e.g., phosphors prepared by flow-based thermochemical synthetic routes described herein) and/or stoichiometric amounts of raw materials can be intermixed with various components to form a mixture. Examples of components for the mixture include, but are not limited to, dopants, dispersants, plasticizers, binders, sintering aids and solvents.

In some embodiments, small quantities of flux materials (e.g., sintering aids) may be used in order to improve sintering properties of the assembly if desired. In some embodiments, the sintering aids may include, but are not limited to, tetraethyl orthosilicate (TEOS), colloidal silica, lithium oxide, titanium oxide, zirconium oxide, magnesium oxide, barium oxide, calcium oxide, strontium oxide, boron oxide, or calcium fluoride. Additional sintering aids include, but are not limited to, alkali metal halides such as NaCl or KCl, and organic compounds such as urea. In some embodiments, the assembly comprises between about 0.01% and about 5%, between about 0.05% and about 5%, between about 0.1% and about 4%, or between about 0.3% and about 1% by weight of the flux material(s) or sintering aid(s). The sintering aid can be intermixed with the raw materials. For example, in some embodiments, tetraethyl orthosilicate (TEOS) can be added to the raw materials to provide the desired amount of sintering aid. In one embodiment, about 0.05% to about 5% by weight of TEOS is provided in the assembly. In some embodiments, the amount of TEOS may be between about 0.3% and about 1% by weight.

Various plasticizers may also be included, in some embodiments, to reduce the glass transition temperature and/or improve flexibility of the ceramic. Non-limiting examples of plasticizers include dicarboxylic/tricarboxylic ester-based plasticizers, such as bis(2-ethylhexyl) phthalate, diisononyl phthalate, bis(n-butyl)phthalate, butyl benzyl phthalate, diisodecyl phthalate, di-n-octyl phthalate, diisooctyl phthalate, diethyl phthalate, diisobutyl phthalate, and di-n-hexyl phthalate; adipate-based plasticizers, such as bis(2-ethylhexyl)adipate, dimethyl adipate, monomethyl adipate, and dioctyl adipate; sebacate-based plasticizers, such as dibutyl sebacate, and maleate; dibutyl maleate; diisobutyl maleate; polyalkylene glycols such as polyethylene glycol, polypropylene glycol, and copolymers thereof; benzoates; epoxidized vegetable oils; sulfonamides, such as N-ethyl toluene sulfonamide, N-(2-hydroxypropyl)benzene sulfonamide, and N-(n-butyl) benzene sulfonamide; organophosphates, such as tricresyl phosphate, tributyl phosphate; glycols/polyethers, such as triethylene glycol dihexanoate, tetraethylene glycol diheptanoate; alkyl citrates, such as triethyl citrate, acetyl triethyl citrate, tributyl citrate, acetyl tributyl citrate, trioctyl citrate, acetyl trioctyl citrate, trihexyl citrate, acetyl trihexyl citrate, butyryl trihexyl citrate, and trimethyl citrate; alkyl sulphonic acid phenyl ester; and mixtures thereof.

In some embodiments, the process may be made easier by occasionally adding binder resin and solvent to the raw powders. A binder is any substance that improves adhesion of the particles of the composition being heated to form a composite. Some non-limiting examples of binders include polyvinyl alcohol, polyvinyl acetate, polyvinyl chloride, polyvinyl butyral, polystyrene, polyethylene glycol, polyvinylpyrrolidones, polyvinyl acetates, and polyvinyl butyrates, etc. In some, but not all, circumstances, it may be useful for the binder to be sufficiently volatile that it can be completely removed or eliminated from the precursor mixture during the sintering phase. Solvents which may be used include, but not limited to water, a lower alkanol such as but not limited to denatured ethanol, methanol, isopropyl alcohol and mixtures thereof, preferably denatured ethanol, xylenes, cyclohexanone, acetone, toluene and methyl ethyl ketone, and mixtures thereof. In some embodiments, the solvent is a mixture of xylenes and ethanol.

In some embodiments, the dispersants can be Flowen, fish oil, long chain polymers, steric acid, oxidized Menhaden fish oil, dicarboxylic acids such succinic acid, orbitan monooleate, ethanedioic acid, propanedioic acid, pentanedioic acid, hexanedioic acid, heptanedioic acid, octanedioic acid, nonanedioic acid, decanedioic acid, o-phthalic acid, p-phthalic acid and mixtures thereof.

The mixture may then be subjected to comminution to form a slurry by, for example, ball milling the mixture for a time period in the range of about 0.5 hrs. to about 100 hrs. (preferably about 6 hrs. to about 48 hrs., or more preferably about 12 hrs. to about 24 hrs.). The ball milling may utilize milling balls that include materials other than the components intermixed within the mixture (e.g., the milling balls may be $ZrO_2$ for a mixture that forms YAG). In an embodiment, the ball milling includes isolating the milling balls after a period of time by filtration or other known methods of isolation. In some embodiments, the slurry has a viscosity in the range of about 10 cP to about 5000 cP (preferably about 100 cP to about 3000 cP, or more preferably about 400 cP to 1000 cP).

Third, the slurry may be cast on a releasing substrate (e.g., a silicone coated polyethylene teraphthalate substrate) to form a tape. For example, the slurry may be cast onto a moving carrier using a doctor blade and dried to form a tape. The thickness of the cast tape can be adjusted by changing the gap between the doctor blade and the moving carrier. In some embodiments, the gap between the doctor blade and the moving carrier is in the range of about 0.125 mm to about 1.25 mm, about 0.25 mm to about 1.00 mm, or about 0.375 mm to about 0.75 mm). Meanwhile, the speed of the moving carrier can have a rate in the range of about 10 cm/min. to about 150 cm/min., 30 cm/min. to about 100 cm/min., or about 40 cm/min. to about 60 cm/min. By adjusting the moving carrier speed and the gap between the doctor blade and moving carrier, the tape can have a thickness between about 20 μm and about 300 μm. The tapes may optionally be cut into desired shapes after casting.

Two or more tapes can be laminated to form the assembly. The lamination step can include stacking two or more tapes (e.g., 2 to 100 tapes are stacked) and subjecting the stacked tapes to heat and uniaxial pressure (e.g., pressure perpendicular to the tape surface). For example, the stacked tapes may be heated above the glass transition temperature ($T_g$) of the binder contained in the tape and compressed uniaxially using metal dies. In some embodiments, the uniaxial pressure is in the range of about 1 to about 500 Mpa or about 30 MPa to about 60 MPa. In some embodiments, the heat and pressure is applied for a time period in the range of about 1 min. to about 60 min, about 15 min. to about 45 min., or about 30 min. The lamination step may optionally include forming various shapes (e.g., holes or pillars) or patterns into the assembly by, for example, using shaped dies.

The stacked tapes can be arranged to obtain the desired assembly configuration and layer thicknesses. For example, the tapes may be stacked to obtain the configurations illustrated in FIGS. 3A and 3B. The thickness of the doped layer and one or more non-doped layers can be modified by changing the number of tapes in the assembly. For example, to obtain a thicker non-doped layer, additional layers of tape can be added to the assembly.

Prior to sintering, an optional debinding process may be completed. The debinding process includes decomposing at least a portion of organic components within the assembly (e.g., volatilize binders and plasticizers within the assembly). As an example, the assembly may be heated in air to a temperature in the range of about 300° C. to about 1200° C., about 500° C. to about 1000° C., or about 800° C. at a rate of about 0.1° C./min. to about 10° C./min., about 0.3° C./min. to about 5° C./min., or about 0.5° C./min. to about 1.5° C./min). The heating step may also include maintaining the temperature for a time period in the range of about 30 min. to about 300 min., which may be selected based upon the thickness of the assembly.

The methods disclosed herein can include sintering the assembly to obtain the ceramic body. A person skilled in the art, guided by the teachings of the present application, can select appropriate configurations for the assembly and sintering conditions to obtain an emissive ceramic such as those disclosed herein having a first region and a second region.

Without being bound to any particular theory, it is believed that the processes disclosed herein cause dopant to diffuse out of the doped layer and into the non-doped layer. Depending on the sintering conditions and assembly configuration, the profile of dopant in the ceramic body can be modified. Similarly, the sintering conditions can affect the size and distribution of grain boundaries in the ceramic body.

Particularly, some of the process factors utilized during the assembly preparation can be applied to control or adjust grain size and distributions in the final ceramic body. These factors include starting powder size, sintering temperature, pressure and time. More specifically, in order to get larger average grain size in both regions, smaller starting powder size, higher sintering temperature and vacuum, and extended sintering time are preferred. For example, the ceramic body may include smaller grain boundaries near its surfaces relative to the core of the ceramic body when sintering includes high temperatures (e.g., 1700° C.). In addition, the grain size distribution can also be controlled by the application of lamination structures such as thicknesses of doped and non-doped layers.

The assembly may be sintered in a vacuum, air, $O_2$, $H_2$, $H_2/N_2$, or a noble gas (e.g., He, Ar, Kr, Xe, Rn, or combinations thereof) at a temperature in the range of about 1200° C. to about 1950° C., about 1300° C. to about 1900° C., about 1350° C. to about 1850° C., or about 1500° C. to about 1800° C. for a time period in the range of about 1 hr. to about 20 hrs, about 2 hrs. to about 10 hrs, or about 2 hours to about 5 hours. In some embodiments, the debinding and sintering processes are completed in a single step.

The assembly may be sandwiched between cover plates during the heating step to reduce distortion (e.g., warping, cambering, bending, etc.) of the assembly. The cover plates may include materials having a melting point above the temperatures applied during the heating step. Moreover, the cover plate may be sufficiently porous to permit transport of volatilized components through the covering plates. As an example, the covering plate may be zirconium dioxide having a porosity of about 40%.

Lighting Apparatus and Methods of Using the Ceramic Body

Some embodiments provide a lighting apparatus having a light source and ceramic body configured to receive at least a portion of the radiation emitted by the light source. The ceramic body may the first region and the second region, such as any of the ceramic bodies disclosed above.

The light source may, in some embodiments, be configured to emit blue radiation. The blue radiation may, for example, have a wavelength of peak emission between about 360 nm and about 500 nm. In some embodiments, the light source emits radiation having a wavelength of peak emission between about 450 nm and about 500 nm. Some embodiments include a light source that is a semiconductor LED. As an example, the light source may be an AlInGaN-based single crystal semiconductor material coupled to an electric source.

Figure 5:
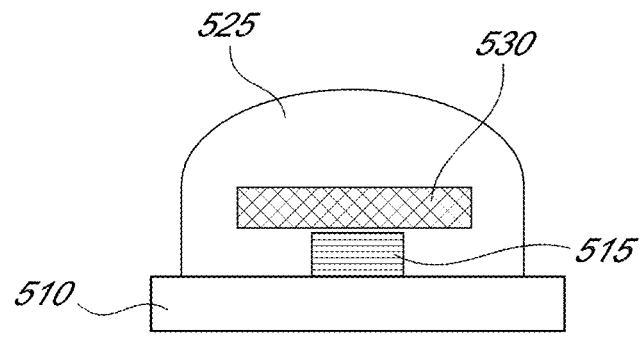
FIG. 5 is an example of a lighting apparatus that may include the ceramic body disclosed herein.

FIG. 5 is an example of a lighting apparatus that may include one or more of the ceramic bodies disclosed herein. Lighting apparatus 500 includes submount 510 and light source 515, such as a conventional base LED mounted thereon. Light source 515 is adjacent to ceramic body 530 which receives at least a portion of the light emitted from the light source 515. An optional encapsulant resin 525 is placed over the light source 515 and the ceramic body 530. Ceramic body 530 can include any of the ceramic bodies disclosed in the present application.

Although devices incorporating LEDs have been described and used as examples, these LEDs represent only some embodiments of the present application. Other suitable optical devices for incorporating sintered ceramic plates include, but not limited to, OLED and IEL.

Also disclosed herein are methods of producing light that include exposing any of the ceramic bodies disclosed in the present application to a blue radiation. The blue radiation may, for example, have a wavelength of peak emission between about 360 nm and about 500 nm. In some embodiments, the blue radiation has a wavelength of peak emission between about 450 nm and about 500 nm.

EXAMPLES

Additional embodiments are disclosed in further detail in the following examples, which are not in any way intended to limit the scope of the claims.

Example 1

(a) $(Y_{0.99}Ce_{0.01})_3Al_5O_{12}$ Solid State Reaction Powder:
2.817 g of $Y_2O_3$ powder (99.99%, Nippon Yttrium Company Ltd.) with BET surface area of 4.6 m$^2$/g, 2.141 g of $Al_2O_3$ powder (99.99%, grade AKP-30, Sumitomo Chemicals Company Ltd.) with BET surface area of 5.6 m2/g, and 0.109 g of Cerium (III) nitrate hexahydrate (99.99% pure, Sigma-Aldrich) were used as precursors to form $(Y_{0.99}Ce_{0.01})_3Al_5O_{12}$ during heating (e.g., during sintering).

(b) $Y_3Al_5O_{12}$ Solid State Reaction Powder:
2.853 g of $Y_2O_3$ powder (99.99%, Nippon Yttrium Company Ltd.) with BET surface area of 4.6 m$^2$/g, 2.147 g of $Al_2O_3$ powder (99.99%, grade AKP-30, Sumitomo Chemicals Company Ltd.) with BET surface area of 5.6 m2/g were used as precursors to form $Y_3Al_5O_{12}$ to form $(Y_{0.99}Ce_{0.01})_3Al_5O_{12}$ during heating (e.g., during sintering).

(c) Forming Assembly:
A 50 ml high purity $Al_2O_3$ ball mill jar was filled with 20 g $Y_2O_3$ stabilized $ZrO_2$ balls of 3 mm diameter. Then 5 g of one of the SSR powder mixtures prepared above, 0.10 g dispersant (Flowlen G-700, Kyoeisha), 0.35 g of poly(vinyl butyral-co-vinyl alcohol-co-vinyl acetate) (Aldrich), 0.175 g Benzyl n-butyl phthalate (98%, Alfa Aesar) and 0.175 g polyethylene glycol (Mn=400, Aldrich), 0.025 g tetraethyl orthosilicate as sintering aids (Fluka), 1.583 g xylene (Fisher Scientific, Laboratory grade) and 1.583 g ethanol (Fisher Scientific, reagent alcohol) were added in the jar. The slurry was produced by ball milling the mixture for 24 hours.

After completing the ball milling, the slurry was passed through a metal screen filter with a pore size of 0.05 mm using a syringe. The obtained slurry was cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on a film applicator was set to obtain the desired thickness. Each cast tape was dried at ambient atmosphere for overnight to produce green sheet.

Figure 6:
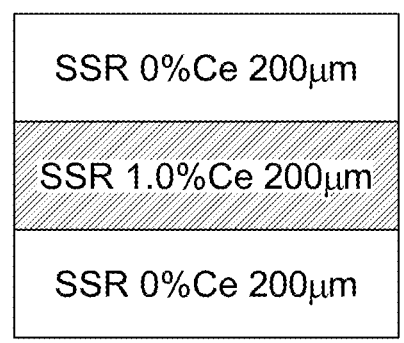
FIG. 6 shows the structure of an assembly that was processed to obtain a ceramic body as disclosed in Example 1.

Dried cast tape comprising SSR $(Y_{0.99}Ce_{0.01})_3Al_5O_{12}$ or $Y_3Al_5O_{12}$ powders were cut into a circular shape having a 13 mm diameter using a metal puncher. In one lamination, five pieces of SSR $(Y_{0.99}Ce_{0.01})_3Al_5O_{12}$ (1.0 at % Ce) cut cast tape (40 μm each) had two pieces of SSR YAG cut cast tapes (100 μm for each piece) layered on each side. The layered composite was placed between circular dies with mirror-polished surfaces and heated on a hot plate to 80° C., then compressed using a hydraulic press machine at a uniaxial pressure of 5 tons for about 5 minutes. The final assembly had a doped layer interposed between two non-doped layers as depicted in FIG. 6.

(d) Sintering:
The assemblies were sandwiched between $ZrO_2$ cover plates (1 mm in thickness, grade 42510-X, ESL Electroscience Inc.) and placed on an $Al_2O_3$ plate having a 5 mm thickness. The assemblies were then heated in a tube furnace in air at rate of 0.5° C./min to 800° C. and held for 2 hours to remove the organic components from the assembly.

After debinding, the assembly was annealed at 1500° C. in a vacuum of $10^{-1}$ Torr for 5 hours at a heating rate of 1° C./min to complete conversion from non-garnet phases of YAG in the layers, including, but not limited to amorphous yttrium oxides, YAP, YAM or $Y_2O_3$ and $Al_2O_3$ to yttrium aluminum garnet (YAG) phase, and increase the YAG grain size.

Following the first annealing, the assembly was further sintered in vacuum of $10^{-3}$ Torr at 1700° C. for 5 hours at heating rate of 5° C./min and cooling rate of 10° C./min to room temperature to produce a transparent/translucent YAG ceramic sheet. When the laminated green sheets are annealed in the furnace with graphite heater, the assemblies were embedded in sacrifice YAG powders of 1 μm to 5 μm to prevent the samples from being partially reduced to constituent metals due to the strong reducing atmosphere. Brownish sintered ceramic bodies were reoxidized in furnace at vacuum atmosphere at 1400° C. for 2 hrs. at heating and cooling rates of 10° C./min and 20° C./min, respectively. The ceramic bodies exhibited a transmittance greater than 70% at 800 nm.

(d) Optical Performance Measurement:

Each ceramic sheet was diced into 2 mm×2 mm using a dicer (MTI, EC400). Optical measurements were performed using an Otsuka Electronics MCPD 7000 multi channel photo detector system together with required optical components such as optical fibers (Otsuka Electronics), 12 inch diameter integrating spheres (Gamma Scientific, GS0IS12-TLS), calibration light source (Gamma Scientific, GS-IS12-OP1) configured for total flux measurement, and excitation light source (Cree blue-LED chip, dominant wavelength 455 nm, C455EZ1000-S2001).

Figure 7:
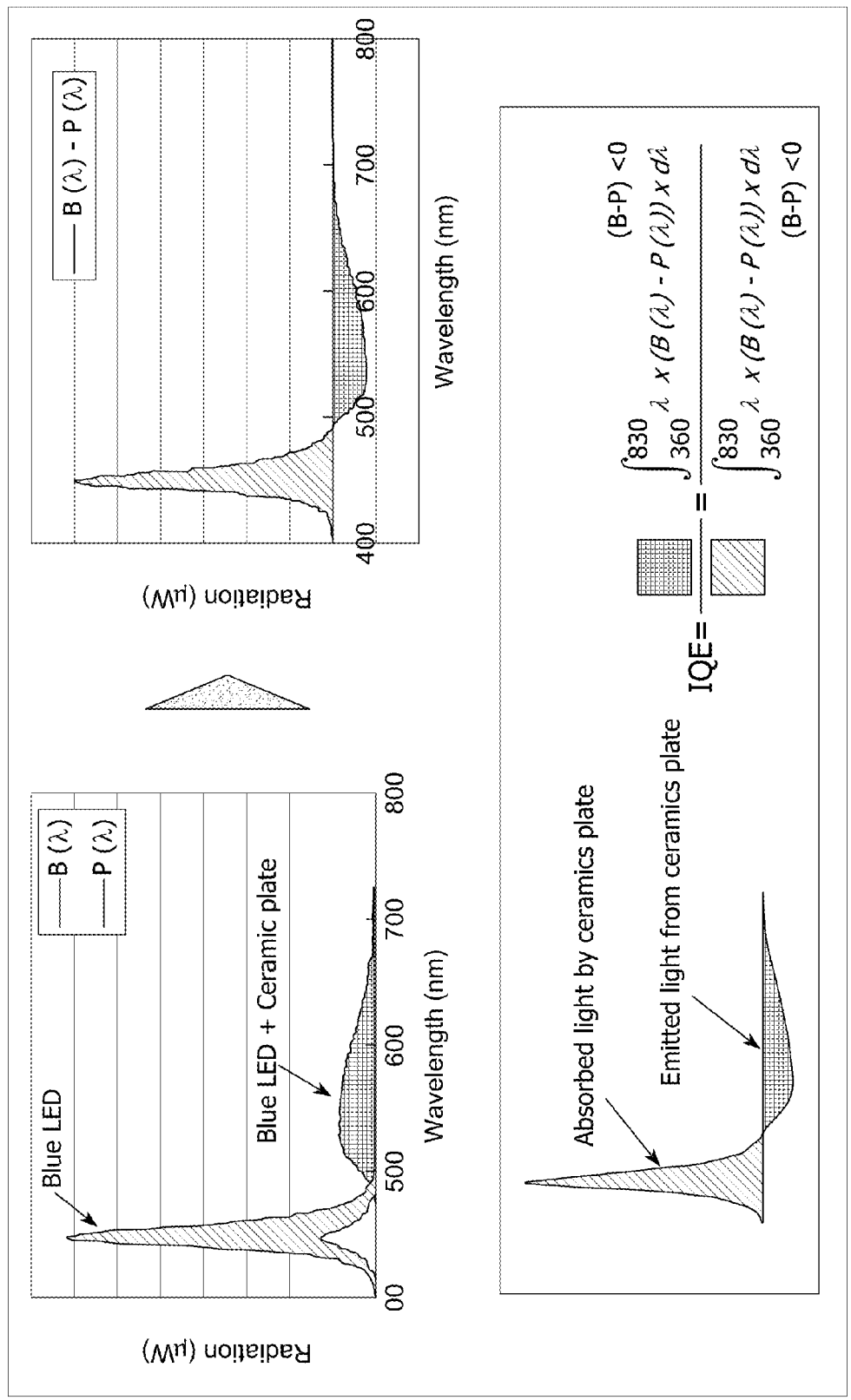
FIG. 7 is an example of how the Internal Quantum Efficiency (IQE) can be determined.

The ceramic body prepared according to the method disclosed above was placed on a light emitting diode (LED) with peak wavelength at 455 nm and an acrylic lens with a refractive index of about 1.45. An LED with the ceramic body was set up inside the integration sphere. The ceramic body was irradiated by the LED with a driving current of 100 mA. The optical radiation of the blue LED with the ceramic body was recorded. Next, the ceramic body was removed from the LED and the radiation for only the blue LED with the acrylic lens was measured. IQE was calculated by integration of the radiation difference from the blue only LED and blue LED/ceramic body combination as shown in FIG. 7. The ceramic body according to the method in Example 1 exhibited an IQE of about 93.

Figure 8A:
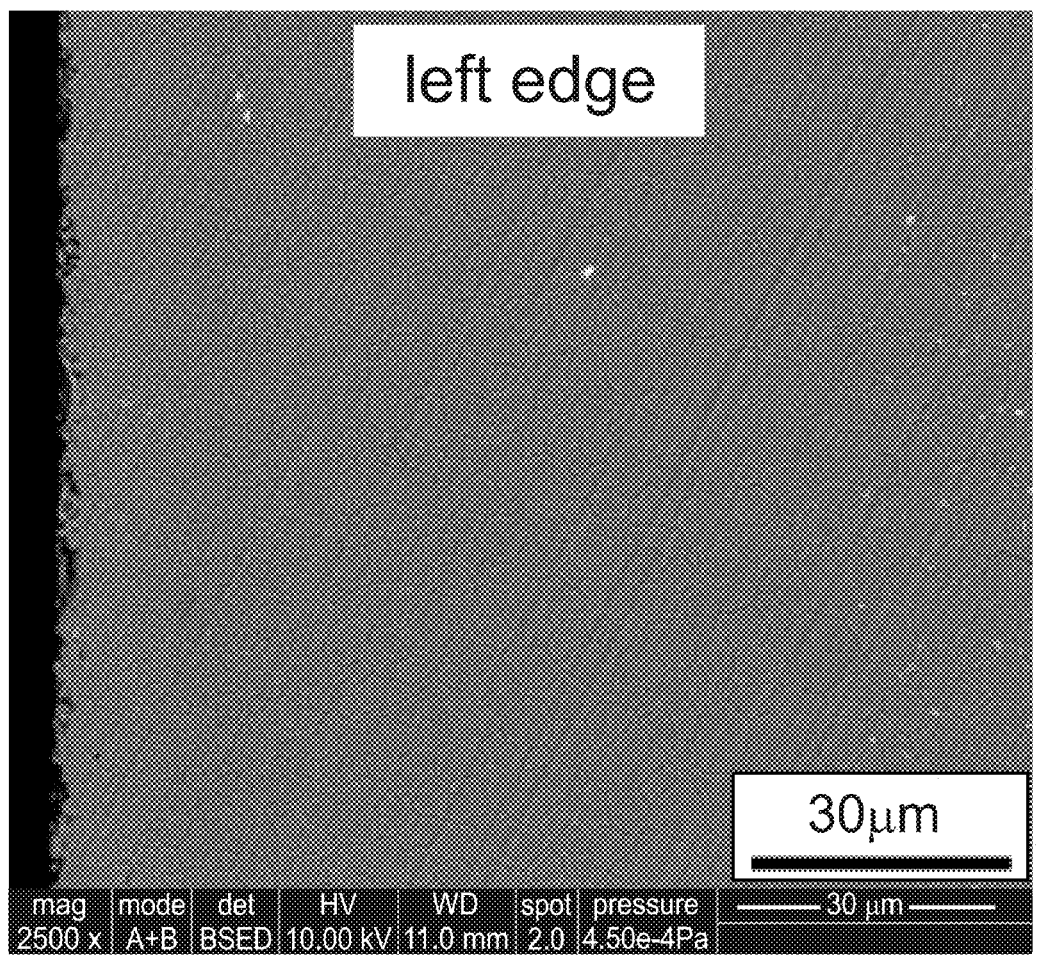
FIGS. 8A-C show Backscattered Electron Mode Scanning Electron Microscopy (SEM-BSE) images of a cross section of the ceramic body prepared according to Example 1, including the left edge region, the middle region and the right edge region, respectively.
Figure 8B:
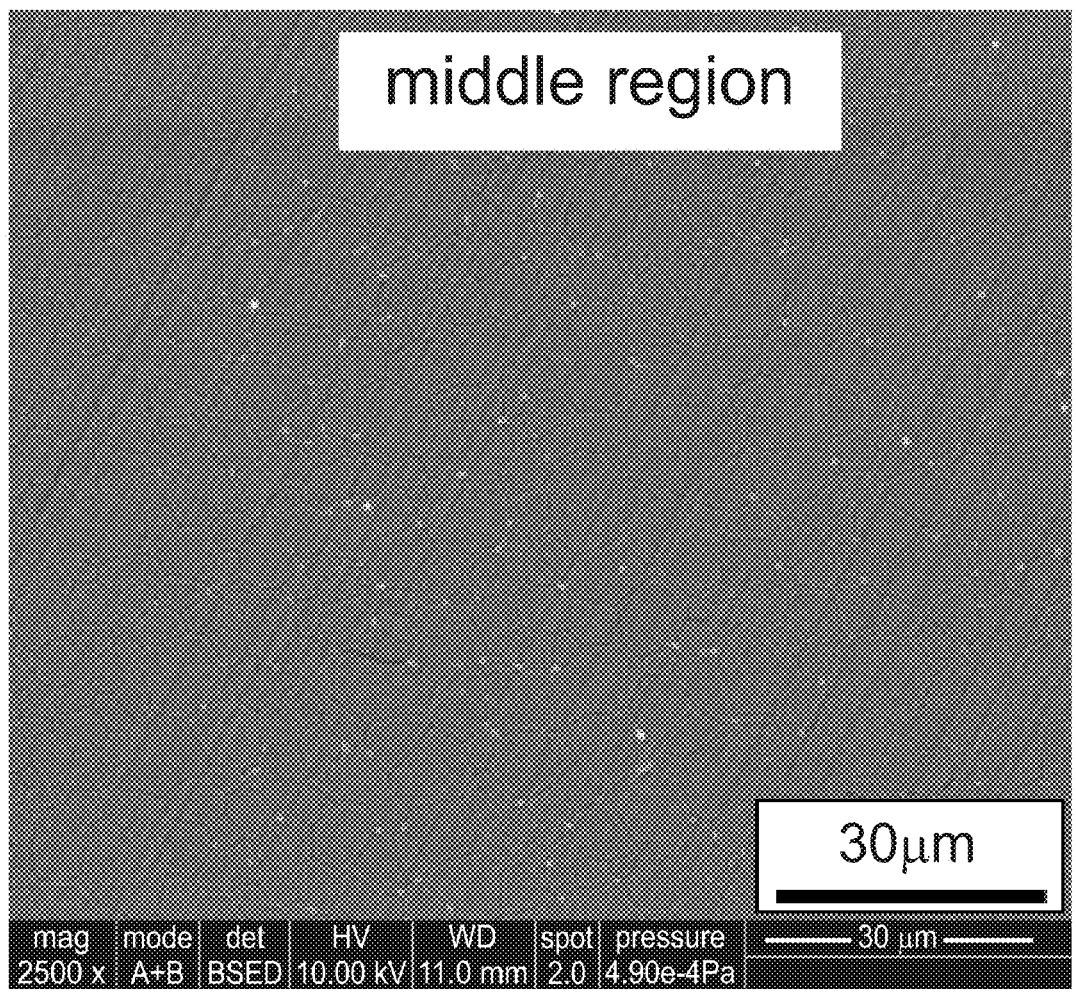
Figure 8C:
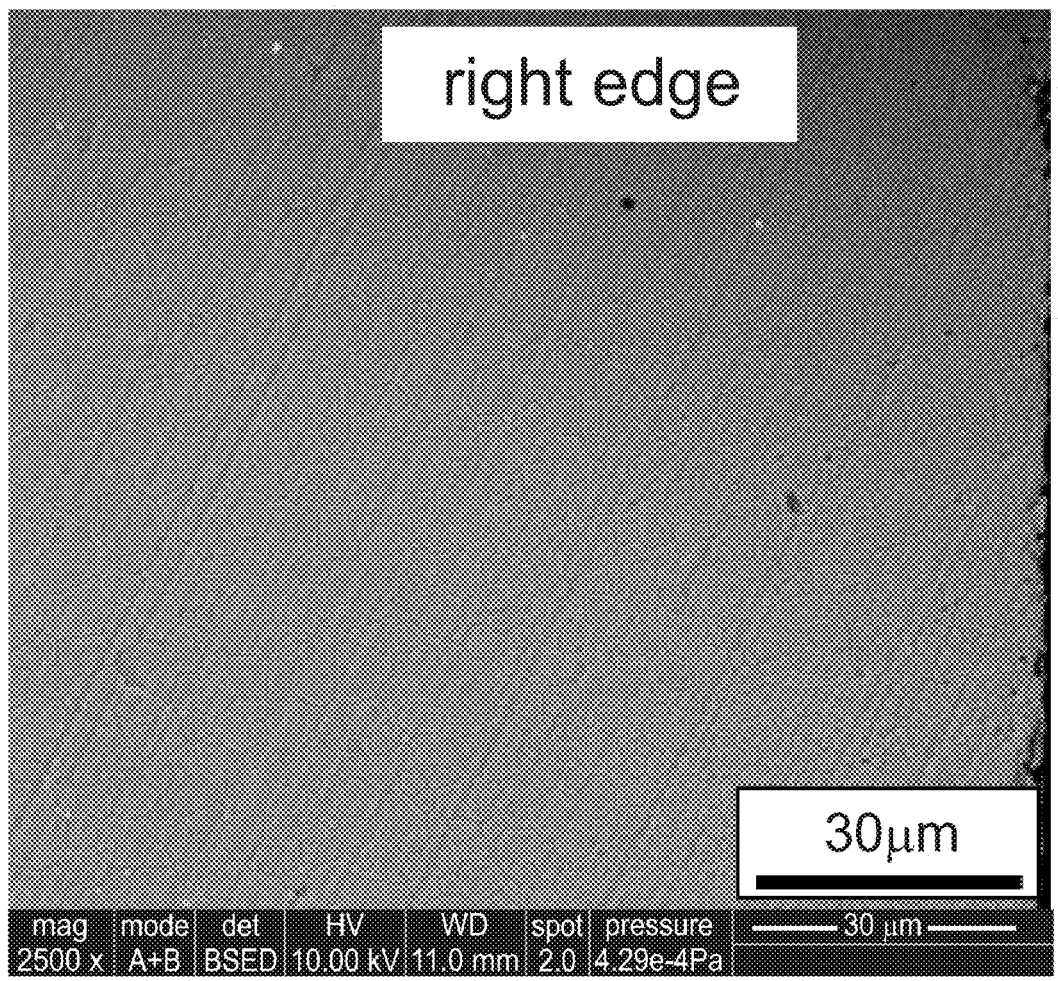

FIGS. 8A-C show Backscattered Electron Mode Scamming Electron Microscopy (SEM-BSE) images of a cross section of the ceramic body prepared according to the method in Example 1, including the left edge region, the middle region and the right edge region. As indicated in the FIGS. 8A-C, the grain sizes on both edges were smaller compared with those in the middle region. And the thickness of the regions with smaller grain sizes was about 40 μm. Outside of the ~40 μm range, the grain sizes in other regions were much larger and quite uniform.

Figure 9:
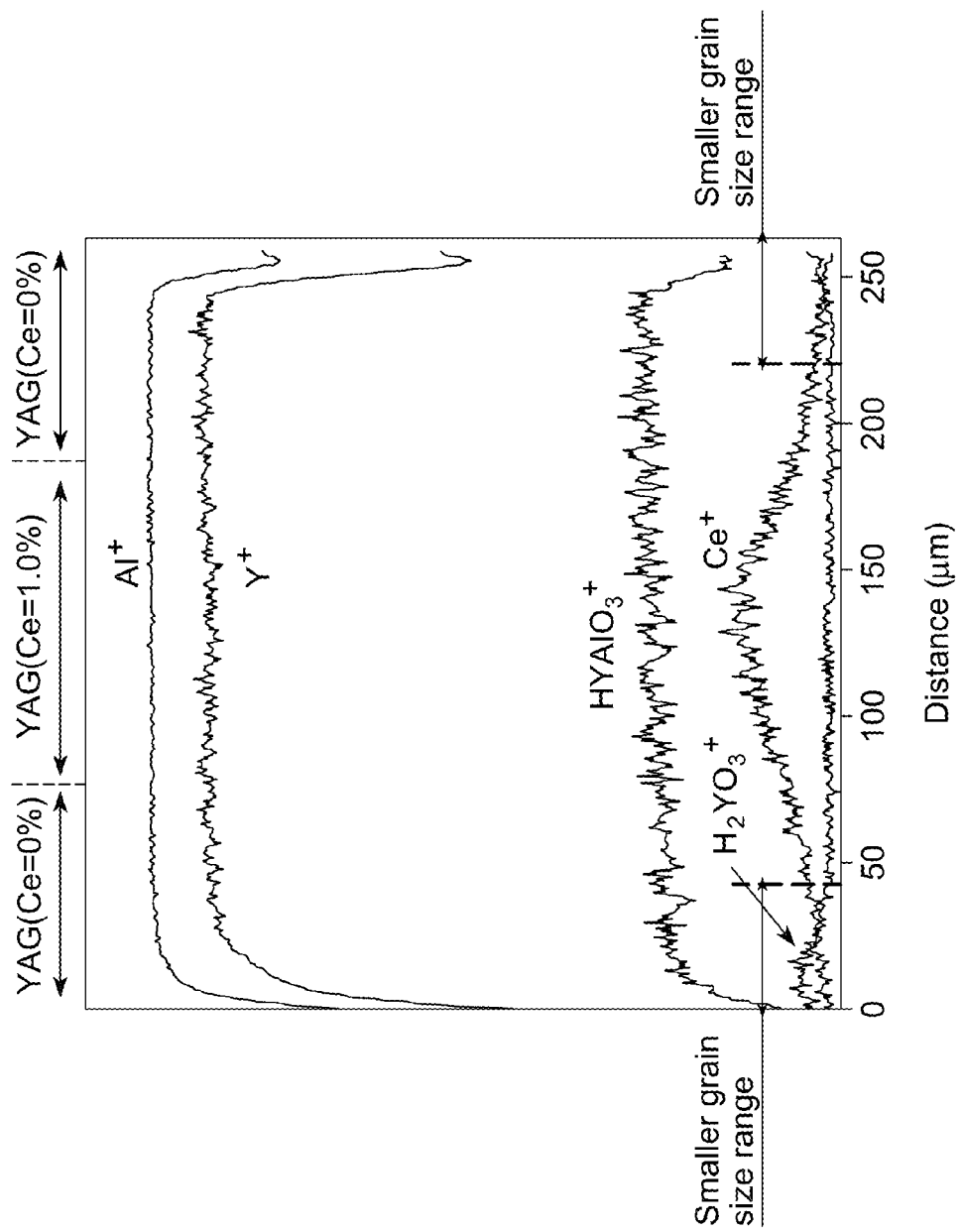
FIG. 9 shows Time-Of-Flight Secondary Ion Mass Spectroscopy (TOF SIMS) analysis of the ceramic body prepared according to Example 1.

FIG. 9 shows Time-Of-Flight Secondary Ion Mass Spectroscopy (TOF SIMS) analysis of the ceramic body prepared according to the method in Example 1. These results show the elemental concentration profile along a cross section of the ceramic body. Ce diffusion was observed in the elemental concentration profile and the amount of Ce ions located at the surfaces of the ceramic body—which included a smaller average grain size—was significantly less than other regions. In this example, the concentration of the $Ce^{3+}$ within the smaller grain sized region is about one-quarter of the peak concentration of the $Ce^{3+}$ within the larger grain size region.

Comparative Example 1

Five pieces of SSR $(Y_{0.99}Ce_{0.01})_3Al_5O_{12}$ (1.0 at % Ce) cut cast tape from Example 1 were layered together to obtain an assembly having a total thickness of about 200 μm. No other layers were included in the assembly. The assembly was prepared into a ceramic body using generally the same processing conditions as in Example 1.

Figure 10A:
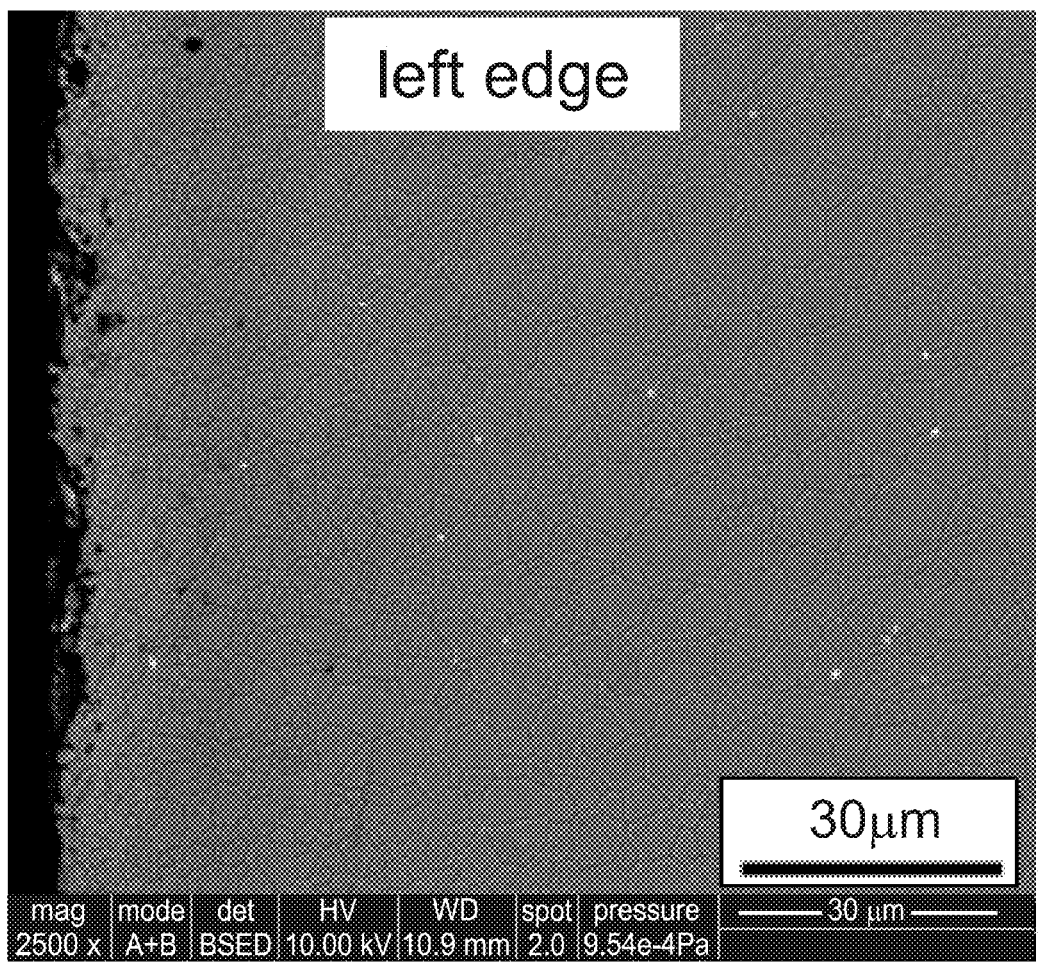
FIGS. 10A-C show Backscattered Electron Mode Scamming Electron Microscopy (SEM-BSE) images of a cross section of the ceramic body prepared according to Comparative Example 1, including the left edge region, the middle region and the right edge region, respectively.
Figure 10B:
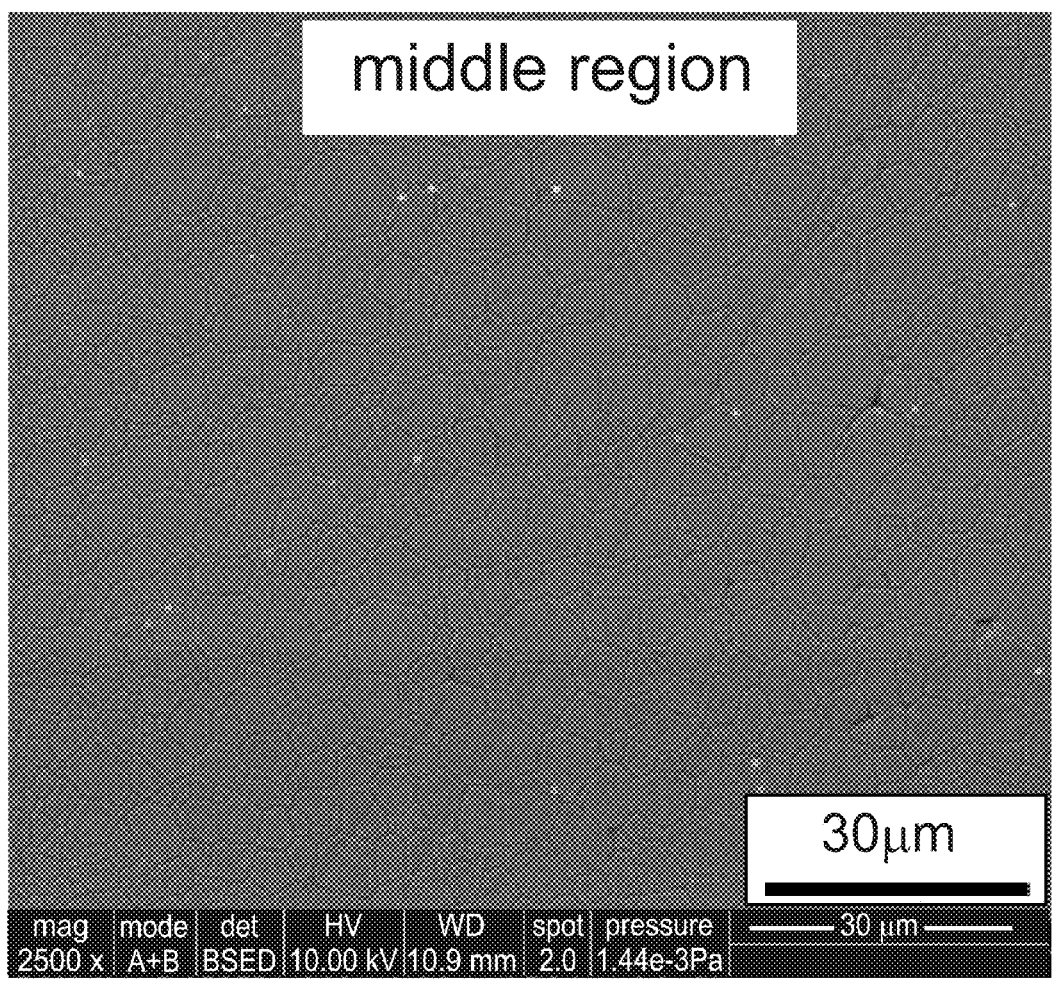
Figure 10C:
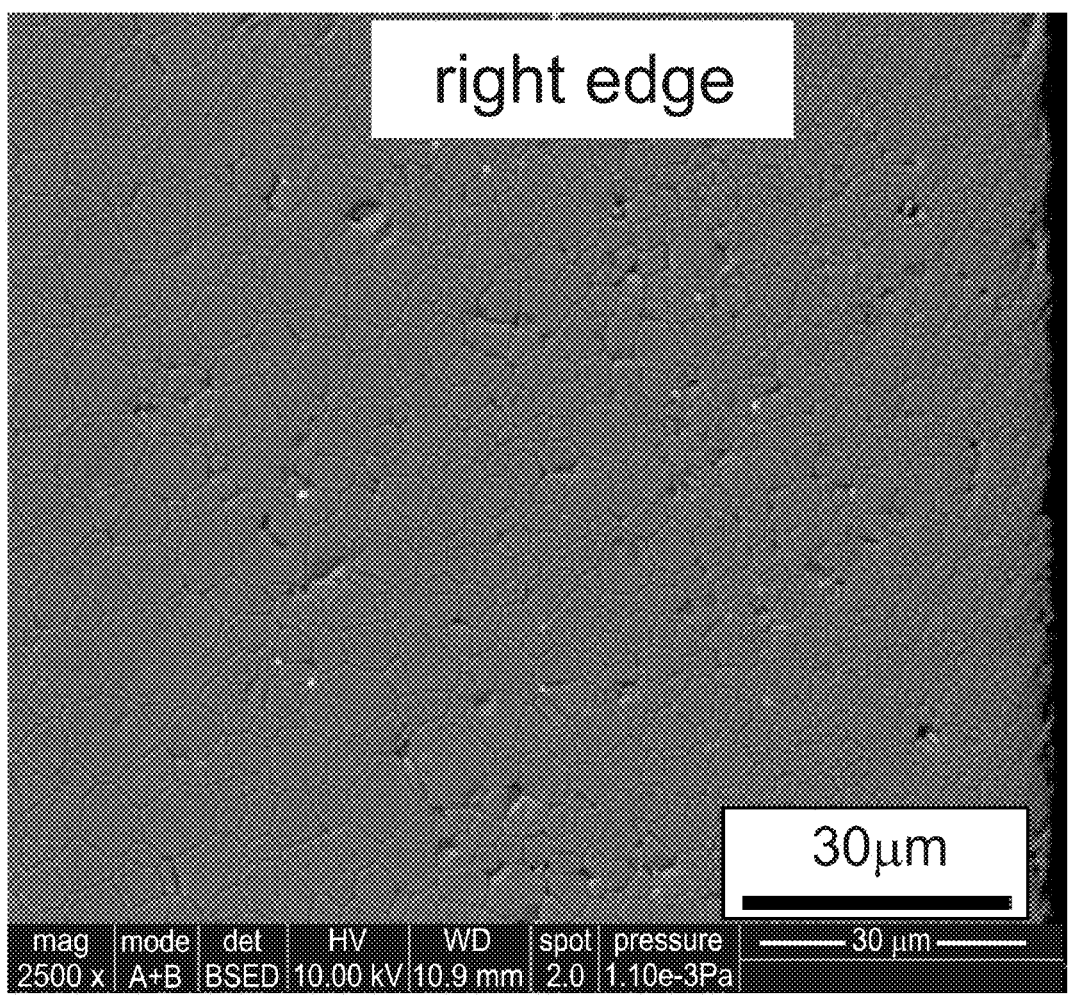

FIGS. 10A-C show SEM-BSE images of cross sections of the ceramic body prepared in Comparative Example 1, including the left edge region, the middle region and the right edge region. As indicated in FIGS. 10A-C, the grain sizes on both edges were smaller compared with those in the middle region. And the thickness the regions with the smaller grain sizes was about 40 μm. Outside of the ~40 μm range, the grain sizes in other regions were much larger and quite uniform.

The IQE was determined for the ceramic body prepared according Comparative Example 1 using generally the same procedures described in Example 1. The ceramic body from Comparative Example 1 exhibited an IQE of about 86 compared to an IQE of about 93 for the ceramic body from Example 1.

The Ce ions in the ceramic body from Comparative Example 1 are expected to have a generally uniform distribution such that a greater amount of Ce ions are located in regions with a smaller average grain size. Accordingly, these results indicate that the IQE can be increased when the Ce ions are preferentially located in regions having a larger average grain size.

Example 2

(a) $(Y_{0.985}Ce_{0.015})_3Al_5O_{12}$ Solid State Reaction Powder:
2.799 g of $Y_2O_3$ powder (99.99%, Nippon Yttrium Company Ltd.) with BET surface area of 4.6 m²/g, 2.139 g of $Al_2O_3$ powder (99.99%, grade AKP-30, Sumitomo Chemicals Company Ltd.) with BET surface area of 5.6 m²/g, and 0.164 g of Cerium (III) nitrate hexahydrate (99.99% pure, Sigma-Aldrich) were used as precursors to form $(Y_{0.985}Ce_{0.015})_3Al_5O_{12}$ during heating (e.g., during sintering).

(b) $Y_3Al_5O_{12}$ Solid State Reaction Powder:
2.853 g of $Y_2O_3$ powder (99.99%, Nippon Yttrium Company Ltd.) with BET surface area of 4.6 m²/g, 2.147 g of $Al_2O_3$ powder (99.99%, grade AKP-30, Sumitomo Chemicals Company Ltd.) with BET surface area of 5.6 m2/g were used as precursors to form $Y_3Al_5O_{12}$ to form $(Y_{0.99}Ce_{0.01})_3Al_5O_{12}$ during heating (e.g., during sintering).

Figure 11A:
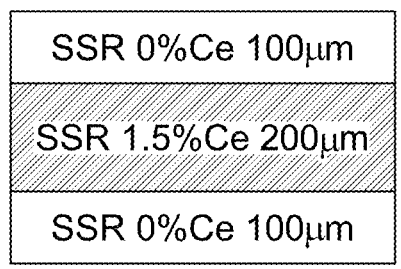
FIGS. 11A-B show the structure of assemblies that were processed to obtain ceramic bodies as disclosed in Example 2.
Figure 11B:
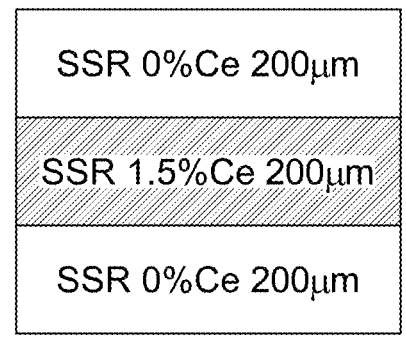

(c) Preparing Ceramic Body:

Two ceramic bodies were prepared using generally the same procedures described in Example 1 except that the assemblies included the configurations shown in FIGS. 11A-B.

The IQE was determined for the ceramic bodies prepared according to Example 2 using generally the same procedure described in Example 1. The ceramic body prepared from the assembly depicted in FIG. 11A was about 85. The ceramic body prepared from the assembly depicted in FIG. 11B was about 93. The ceramic body prepared from the assembly depicted in FIG. 11A included thinner non-doped layers and therefore it is expected that a greater amount of Ce ions diffused near the surface regions having a smaller average grain size. Consequently, these results further support that the IQE can be increased when the Ce ions are preferentially located in regions with a larger average grain size.

Comparative Example 2

Five pieces of SSR $(Y_{0.985}Ce_{0.015})_3Al_5O_{12}$ (1.5 at % Ce) cut cast tape from Example 2 were layered together to obtain an assembly having a total thickness of about 200 μm. No other layers were included in the assembly. The assembly was prepared into a ceramic body using generally the same processing conditions as in Example 1.

The IQE was determined for the ceramic body prepared according Comparative Example 2 using generally the same procedures described in Example 1. The ceramic body from Comparative Example 2 exhibited an IQE of about 77 compared to an IQE of about 85 and about 93 for the ceramic bodies from Example 2.

The Ce ions in the ceramic body from Comparative Example 2 are expected to have a generally uniform distribution such that a greater proportion of Ce ions are located in regions with a smaller average grain size. Accordingly, these results indicate that the IQE can be increased when the Ce ions are preferentially located in regions having a larger average grain size.

Example 3

(a) $(Y_{0.897}Gd_{0.10}Ce_{0.003})_3Al_5O_{12}$ Solid State Reaction Powder: 2.472 g of $Y_2O_3$ powder (99.99%, Nippon Yttrium Company Ltd.) with BET surface area of 4.6 m$^2$/g, 2.074 g of $Al_2O_3$ powder (99.99%, grade AKP-30, Sumitomo Chemicals Company Ltd.) with BET surface area of 5.6 m2/g, 0.442 g of $Gd_2O_3$ powder (99.99% Pangea Ltd), and 0.032 g of Cerium (III) nitrate hexahydrate (99.99% pure, Sigma-Aldrich) were used as precursors to form $Y_{0.897}Gd_{0.10}Ce_{0.003})_3Al_5O_{12}$ during heating (e.g., during sintering).

What is claimed is:

1. A ceramic body comprising:
    a first region comprising a host material and a first concentration of a dopant, wherein the first concentration is effective to produce luminescence; and
    a second region comprising the host material and a second concentration of the dopant, wherein the second concentration is less than the first concentration;
    wherein the first region has an average grain size larger than an average grain size of the second region; and
    the ceramic body exhibits an internal quantum efficiency (IQE) of at least about 0.80 when exposed to radiation having a wavelength of about 455 nm.

2. The ceramic body of claim 1, wherein the host material is represented by the formula $A_3B_5O_{12}$, wherein:
    A is selected from the group consisting of Y, Lu, Ca, La, Tb, Gd and combinations thereof; and
    B is selected from the group consisting of Al, Mg, Si, Ga, In, and combinations thereof.

3. The ceramic body of claim 1, wherein the host material is selected from $Y_3Al_5O_{12}$, $(Y, Tb)_3Al_5O_{12}$, $(Y, Gd)_3Al_5O_{12}$, $(Y, Gd)_3(Al, Ga)_5O_{12}$, $(Sr, Ca, Ba)_2SiO_4$, $Lu_3Al_5O_{12}$, $Lu_2CaMg_2Si_3O_{12}$, $Lu_2CaAl_4SiO_{12}$, $Ca_3Sc_2Si_3O_{12}$, $Ba_3MgSi_2O_8$, $BaMgAl_{10}O_{17}$, $La_2O_2S$, $SrGa_2S_4$, $CaAlSiN_3$, $Ca_2Si_5N_8$, and CaSiAlON.

4. The ceramic body of claim 1, wherein the host material is $Y_3Al_5O_{12}$.

5. The ceramic body of claim 1, wherein the dopant is a rare earth metal.

6. The ceramic body of claim 1, wherein the dopant is select from the group consisting of Ce, La, Tb, Pr, Eu, and combinations thereof.

7. The ceramic body of claim 1, wherein the dopant is Ce.

8. The ceramic body of claim 1, wherein the first region has an average grain size of about 5 μm to about 100 μm.

9. The ceramic body of claim 1, wherein the second region has an average grain size of less than about 30 μm.

10. The ceramic body of claim 1, wherein the second concentration of dopant is no more than about 0.2 at %.

11. The ceramic body of claim 1, wherein a ratio of the first concentration of dopant to the second concentration of dopant is in the range of about 4:1 to about 1:1.

12. The ceramic body of claim 1, wherein the first region comprises a central core of the ceramic body.

13. The ceramic body of claim 1, where the second region comprises an outer peripheral of the ceramic body.

14. The ceramic body of claim 1, wherein the first region adjoins the second region.

15. The ceramic body of claim 1, the ceramic body further comprising a third region comprising the host material and a third concentration of the dopant, wherein the third concentration is less than the first concentration, the first region has an average grain size larger than an average grain size of the third region, and the first region is between the second and third regions.

16. The ceramic body of claim 15, wherein:
    the second region comprises a first surface of the ceramic body;
    the third region comprises a second surface of the ceramic body; and
    the first and second surface are on opposite sides of the ceramic body.

17. The ceramic body of claim 15, wherein the first, second, and third regions are separate layers.

18. The ceramic body of claim 15, wherein the third region has an average grain size less than about 30 μm.

19. The ceramic body of claim 15, wherein the third concentration of dopant is no more than about 0.2 at %.

20. The ceramic body of claim 15, wherein a ratio of the first concentration of dopant to the third concentration of dopant is in the range of about 4:1 to about 1:1.

21. A method of forming a ceramic body of claim 1 comprising:
    forming an assembly, wherein forming the assembly comprises:
        providing a first non-doped layer comprising a host material, a host material precursor, or combination thereof, wherein the first non-doped layer has a thickness in the range of about 40 μm to about 800 μm; and
        disposing a doped layer on the first non-doped layer, wherein the doped layer has a thickness in the range of about 10 μm to about 400 μm, and comprises the host material, the host material precursor, or combination thereof, and a dopant; and
    sintering the assembly to form the ceramic body comprising a first region and a second region, wherein an average grain size of the first region is larger than an average grain size of the second region;
    wherein the first region comprises a first concentration of the dopant that is effective to produce luminescence, and the second region comprises a second concentration of the dopant that is less than the first concentration of the dopant.

22. A lighting apparatus comprising:
    a light source configured to emit blue radiation; and
    the ceramic body of claim 1, wherein the ceramic body is configured to receive at least a portion of the blue radiation.

* * * * *